(12) United States Patent
Allen et al.

(10) Patent No.: US 8,431,670 B2
(45) Date of Patent: Apr. 30, 2013

(54) PHOTO-PATTERNABLE DIELECTRIC MATERIALS AND FORMULATIONS AND METHODS OF USE

(75) Inventors: Robert David Allen, San Jose, CA (US); Phillip Joe Brock, San Jose, CA (US); Blake W. Davis, San Jose, CA (US); Qinghuang Lin, Yorktown Heights, NY (US); Robert Dennis Miller, San Jose, CA (US); Alshakim Nelson, San Jose, CA (US); Ratnam Sooriyakumaran, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 656 days.

(21) Appl. No.: 12/550,683

(22) Filed: Aug. 31, 2009

(65) Prior Publication Data

US 2011/0048787 A1 Mar. 3, 2011

(51) Int. Cl.
*C08G 77/20* (2006.01)
(52) U.S. Cl.
USPC .............................................. 528/32; 528/35

(58) Field of Classification Search ............ 528/32, 528/35
See application file for complete search history.

(56) References Cited

U.S. PATENT DOCUMENTS

| | | |
|---|---|---|
| 6,936,537 B2 | 8/2005 | Hogle et al. |
| 7,306,853 B2 | 12/2007 | Lin et al. |
| 7,410,914 B2 | 8/2008 | Kuehnle et al. |
| 2005/0053861 A1* | 3/2005 | Yoneda et al. ............. 430/270.1 |
| 2006/0024980 A1 | 2/2006 | Tsuchiya et al. |
| 2007/0142551 A1 | 6/2007 | Kunzler et al. |
| 2007/0238317 A1 | 10/2007 | Allen et al. |
| 2008/0166871 A1 | 7/2008 | Allen et al. |
| 2009/0079075 A1 | 3/2009 | Lin et al. |

OTHER PUBLICATIONS

Ex parte Malz (Bd. Pat. App. & Int. 2010)(Appeal No. 2009-95123)(Feb. 2010).*

* cited by examiner

*Primary Examiner* — Kuo-Liang Peng
(74) *Attorney, Agent, or Firm* — Schmeiser, Olsen & Watts

(57) ABSTRACT

Silsesquioxane polymers, silsesquioxane polymers in negative tone photo-patternable dielectric formulations, methods of forming structures using negative tone photo-patternable dielectric formulations containing silsesquioxane polymers, and structures made from silsesquioxane polymers.

24 Claims, 7 Drawing Sheets

PHOTO-PATTERNABLE DIELECTRIC MATERIALS AND FORMULATIONS AND METHODS OF USE

FIELD OF THE INVENTION

The present invention relates to the field of photo-patternable dielectric materials; more specifically, it relates to patternable dielectric materials, photo-sensitive formulations containing patternable dielectric materials, methods of using photo-sensitive formulations containing patternable dielectric materials in the fabrication of integrated circuits, and integrated circuit structures comprising patternable dielectric materials.

BACKGROUND OF THE INVENTION

Integrated circuits include, for example, active devices such as field effect transistors partially formed in a semiconductor substrate and interconnected by wiring levels comprising wires formed in interlevel dielectric layers formed on the substrate. Conventional wiring levels are formed by depositing an interlevel dielectric layer, patterning a photoresist layer formed on the dielectric layer, etching trenches in the dielectric layer, removing the photoresist and filling the trenches with metal. This is an expensive and time-consuming process. Accordingly, there exists a need in the art to mitigate the deficiencies and limitations described hereinabove.

SUMMARY OF THE INVENTION

A first aspect of the present invention is a composition of matter comprising: a silsesquioxane polymer comprising three or four monomers of the structural formulas (1), (2), (3), (4):

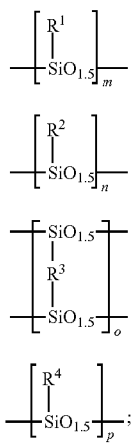

wherein two of the three or four monomers are structures (1) and (2); wherein $R^1$ is selected from the group consisting of linear alkyl, branched alkyl, cycloalkyl, aromatic, arene and ester moieties; wherein $R^2$ is selected from the group consisting of vinyl, substituted-vinyl, acetylenic, substituted acetylenic and nitrile moieties; wherein $R^3$ is selected from the group consisting of linear alkyl, branched alkyl and cycloalkyl moieties; wherein $R^4$ is selected from the group consisting of linear alkoxy, branched alkoxy, cycloalkoxy, acetoxys, hydroxyl, silyloxy and silanol moieties; and wherein m, n, o, and p represent the mole percent (mol%) of repeating units with m+n+o+p equal to or greater than about 40 mol % and wherein when only three monomers are present either o or p is zero.

A second aspect of the present invention is a photoactive formulation, comprising: a photoacid generator; a casting solvent; and a silsesquioxane polymer comprising three or four monomers of the structural formulas (1), (2), (3), (4):

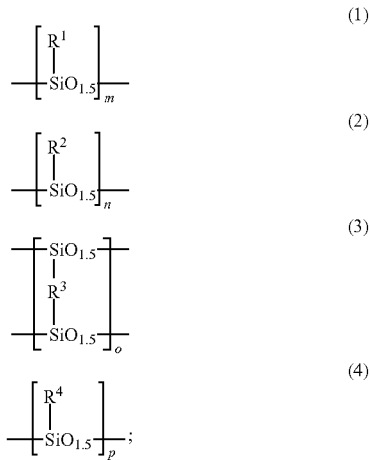

wherein two of the three or four monomers are structures (1) and (2); wherein $R^1$ is selected from the group consisting of linear alkyl, branched alkyl, cycloalkyl, aromatic, arene and ester moieties; wherein $R^2$ is selected from the group consisting of vinyl, substituted-vinyl, acetylenic, substituted acetylenic and nitrile moieties; wherein $R^3$ is selected from the group consisting of linear alkyl, branched alkyl and cycloalkyl moieties; wherein $R^4$ is selected from the group consisting of linear alkoxy, branched alkoxy, cycloalkoxy, acetoxys, hydroxyl, silyloxy and silanol moieties; and wherein m, n, o, and p represent the mole percent (mol %) of repeating units with m+n+o+p equal to or greater than about 40 mol % and wherein when only three monomers are present either o or p is zero.

A third aspect of the present invention is a method, comprising: (a) forming on a substrate, a layer of a photoactive formulation comprising: a photoacid generator; a casting solvent; and a silsesquioxane polymer; (b) patternwise exposing the layer with ultraviolet light to generate an exposed layer; (c) baking the exposed layer to cross-link the silsesquioxane polymer in regions of the exposed layer exposed to the ultraviolet light to generate a baked layer; (d) developing the baked layer to remove portions of the baked layer not exposed to the ultraviolet light to form a first trench in a developed layer; (e) curing the developed layer to further cross-link the silsesquioxane polymer and form a patterned cured layer including the first trench; and (f) filling the first trench in the patterned cured layer with an electrically conductive material.

A fourth aspect of the present invention is a structure, comprising: a cross-linked layer of a silsesquioxane polymer or a silsesquioxane polymer on a substrate; a trench in the cross-linked layer; an electrically conductive material filling the trench and contacting the substrate in a bottom of the trench; and wherein the silsesquioxane polymer comprises three or four monomers of the structural formulas (1), (2), (3), (4):

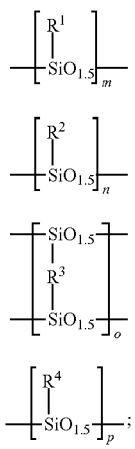

wherein two of the three or four monomers are structures (1) and (2); wherein $R^1$ is selected from the group consisting of linear alkyl, branched alkyl, cycloalkyl, aromatic, arene and ester moieties; wherein $R^2$ is selected from the group consisting of vinyl, substituted-vinyl, acetylenic, substituted acetylenic and nitrile moieties; wherein $R^3$ is selected from the group consisting of linear alkyl, branched alkyl and cycloalkyl moieties; wherein $R^4$ is selected from the group consisting of linear alkoxy, branched alkoxy, cycloalkoxy, acetoxys, hydroxyl, silyloxy and silanol moieties; and wherein m, n, o, and p represent the mole percent (mol %) of repeating units with m+n+o+p equal to or greater than about 40 mol % and wherein when only three monomers are present either o or p is zero.

These and other aspects of the invention are described below.

BRIEF DESCRIPTION OF THE DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION OF THE INVENTION

Figure 1A:
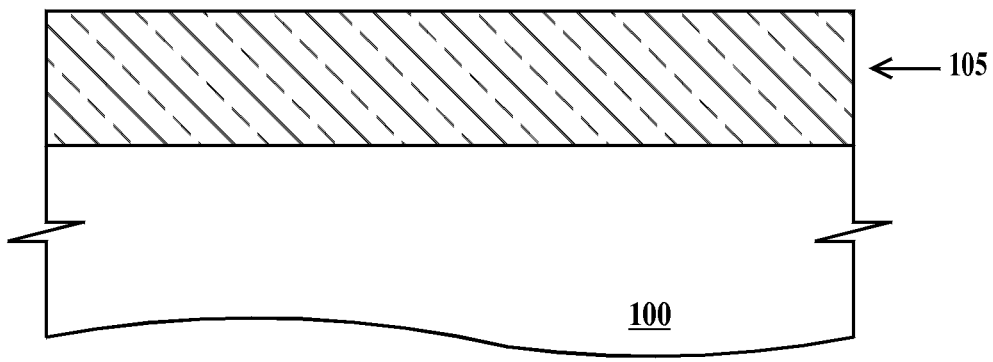
FIGS. 1A through 1C illustrate steps in a method of forming single or dual-damascene wires using a photo-patternable dielectric material according to embodiments of the present invention.

The present invention describes silsesquioxane polymers, which in a first example are terpolymers and in a second example are silsesquioxane quadpolymers that may be mixed with one or more photoacid generators, an optional casting solvent and one or more optional additives to form a negative tone photo-patternable dielectric formulation. The silsesquioxane polymers in the embodiments of the present invention may be linear polymers, branched polymers, caged polymers or combinations of thereof The silsesquioxane polymers of embodiments of the present invention are preferably aqueous base soluble. Patternwise exposure of a layer of the formulation directly forms a cross-linked patterned dielectric layer (without the use of photoresist based lithography or etching of the dielectric layer) after development. After curing to further cross-link the patterned dielectric layer a low dielectric constant (k) patterned dielectric layer is produced. A low-k material is defined as a material having a dielectric constant of about 3.0 or less. The silsesquioxane polymers of the present invention may preferably contain silanol end-groups with silyl ethers and silyl alcohols preferred (and may contain monomers having silanol moieties with silyl ethers and silyl alcohols preferred) which cause cross-linking via condensation polymerization in the presence of acid released by the photoacid generator after exposure to light (heat increases the efficiency of the polymerization). Cross-linking enables the formation of chemical bonds, which can withstand standard thermal curing and subsequent curing conditions such as ultraviolet (UV)-thermal treatment. The silsesquioxane polymers of the present invention preferably contain at least one monomer having a vinyl or an acetylenic moiety which further crosslinks the polymer during the curing process. The additional crosslinking provided by reacting the vinyl or acetylenic moiety improves the mechanical properties of the material which is highly desirable for creating robust low-k materials.

The silsesquioxane polymers of the present invention are particularly useful in forming damascene and dual-damascene wires without the use of a photoresist since they can be patterned directly.

A damascene process is one in which a dielectric layer having wire trenches or via openings extending through a dielectric layer is formed, an electrical conductor of sufficient thickness to fill the trenches is deposited in the trenches and on a top surface of the dielectric, and a chemical-mechanical-polish (CMP) process is performed to remove excess conductor and make the surface of the conductor co-planar with the surface of the dielectric layer to form damascene wires (or damascene vias). When only a trench and a wire (or a via opening and a via) are formed the process is called single-damascene.

A via-first dual-damascene process (according to embodiments of the present invention) is one in which a first dielectric layer having via openings extending through the first dielectric layer are formed followed by formation of a second dielectric layer having trenches extending through the second dielectric layer and intersecting the trenches in the first dielectric layer. All via openings are intersected by integral wire trenches above, but not all trenches need intersect a via opening. An electrical conductor of sufficient thickness to fill the trenches and via openings is deposited on a top surface of the dielectric and a CMP process is performed to make the surface of the conductor in the trench co-planar with the surface the dielectric layer to form dual-damascene wires and dual-damascene wires having integral dual-damascene vias.

In silsesquioxane polymers according to embodiments of the present invention, $R^1$ is selected from the group consisting of linear alkyl, branched alkyl, cycloalkyl, aromatic, arene and ester moieties; $R^2$ is a selected from the group consisting of vinyl, substituted-vinyl, acetylenic, substituted acetylenic and nitrile moieties; $R^3$ is selected from the group consisting of linear alkyl, branched alkyl and cycloalkyl moieties; and $R^4$ is selected from the group consisting of linear alkoxy, branched alkoxy, cycloalkoxy, acetoxys, hydroxyl, silyloxy and silanol moieties. Preferred $R^1$ moieties are selected from the group consisting of methyl, ethyl, propyl, isopropyl, cyclohexyl, and norbornyl groups. A preferred $R^2$ moiety is a vinyl group. A preferred $R^3$ moiety is an ethyl group. A preferred $R^4$ moiety is a hydroxyl group.

In one example, the silsesquioxane polymers of the present invention comprise three or four monomers of the structural formulas (1), (2), (3) (4):

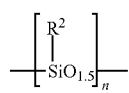

(1)

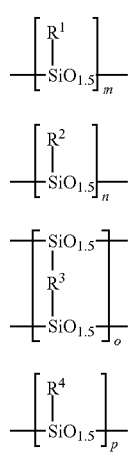

(2)

(3)

(4)

wherein $R^1$ is a carbon containing group for controlling polymer dissolution in aqueous base; $R^2$ is a vinyl or acetylenic moiety for cross-linking during post exposure baking (described infra); $R^3$ is a $C_1$-$C_{18}$ hydrocarbon moiety and structural formula (3) is a bridge monomer (allows branched polymers); and $R^4$ is a hydroxyl, alkoxy, silyloxy, or a silanol moiety for cross-linking during curing (described infra), and m, n, o, and p represent the mole percent (mol %) of repeating units. Mol% is mol-fraction times 100. 10 mol % is thus 0.1 mol fraction. 10 mol % indicates that there is 1 mole of monomer in each 10 moles of polymer. The silsesquioxane polymers of the embodiments of the present invention have hydroxyl, alkoxy, silyloxy or silanol endgroups.

In one example, silsesquioxane polymers according to the present invention comprise monomers of structural formulas (1), (2) and (3) with m+n+o equal to or greater than about 40 mol %, with equal to or greater than about 75% preferred, equal to or greater than about 95more preferred, and equal to or greater than about 99% still more preferred. In one example, silsesquioxane polymers according to the present invention comprise monomers of structural formulas (1), (2) and (4) with m+n+p equal to or greater than about 40 mol %, with equal to or greater than about 75% preferred, equal to or greater than about 95% more preferred, and equal to or greater than about 99% still more preferred. In one example polymers according to the present invention comprise monomers of structural formulas (1), (2), (3) and (4) with m+n+o+p equal or greater than about 40 mol %, with equal to or greater than about 75% preferred, equal to or greater than about 95% more preferred, and equal to or greater than about 99% still more preferred.

In one example, for silsesquioxane polymers, m is between about 30 mol % and about 90 mol %, n is between 1 mol % and about 30 mol %, o is between about 0 mol % and about 10 mol % and p is between about 0 mol % and about 20 mol % of the final polymer composition, where 0 mol % indicates the monomer is not present in the polymer. When a monomer of structural (3) is present in the polymer, o has a minimum value of about 0.5 mol %. When a monomer of structural formula (4) is present in the polymer, p has a minimum value of about 0.5 mol %.

In one example, the silsesquioxane polymers of the present invention consist essentially of three or four monomers of the structural formulas (1), (2), (3) (4):

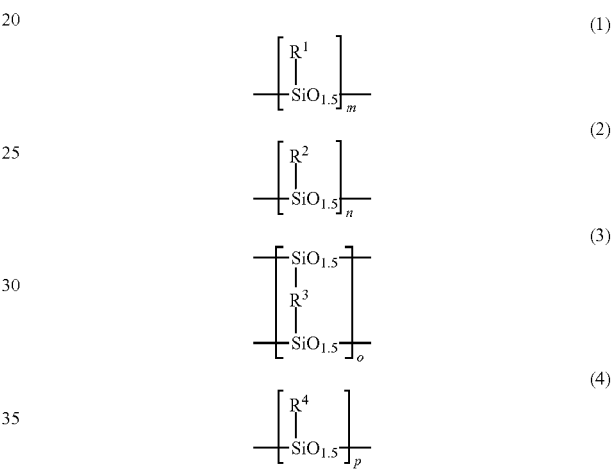

wherein $R^1$ is a carbon containing group for controlling polymer dissolution in aqueous base; $R^2$ is a vinyl or acetylenic moiety for cross-linking during post exposure baking (described infra); $R^3$ is a $C_1$-$C_{18}$ hydrocarbon moiety and structural formula (3) is a bridge monomer (allows branched polymers); and $R^4$ is a hydroxyl, alkoxy, silyloxy, or a silanol moiety for cross-linking during curing (described infra), and m+n+o+p is equal to about 100 mol %.

In a preferred first silsesquioxane terpolymer, consisting essentially of monomers of structural formulas (1), (2) and (3) of the invention, $R^1$ is a methyl moiety and m is between about 70 mol % and about 80 mol %, $R^2$ is a vinyl moiety and n is between about 3 mol % and about 13 mol %, and $R^3$ is an ethyl moiety and o is between about 0.5 mol % and about 6 mol %.

In a preferred second silsesquioxane terpolymer, consisting essentially of monomers of structural formulas (1), (2) and (4) of the invention, $R^1$ is a methyl moiety and m is between about 70 mol % and about 80 mol %, $R^2$ is a vinyl moiety and n is between about 3 mol % and about 13 mol %, and $R^4$ is a hydroxyl moiety and p is between about 2 mol % and about 10 mol %.

In a preferred silsesquioxane quadpolymer, consisting essentially of monomers of structural formulas (1), (2), (3) and (4), $R^1$ is a methyl moiety and m is between about 70 mol % and about 80 mol %, $R^2$ is a vinyl moiety and n is between about 3 mol % and about 13 mol %, $R^3$ is an ethyl moiety and o is between about 0.5 mol % and about 6 mol %, and $R^4$ is a hydroxyl moiety and p is between about 2 mol % and about 10 mol %.

In one example, the silsesquioxane polymers of the embodiments of the present invention have a weight-averaged molecular weight between about 400 Daltons and about 500,000 Daltons. In one example, the silsesquioxane polymers of the embodiments of the present invention have a weight-averaged molecular weight between about 1,500 Daltons and about 20,000 Daltons.

Negative tone photo-patternable dielectric formulations according to embodiments of the of the present invention include the silsesquioxane terpolymers and silsesquioxane quadpolymers of combinations of monomers (1), (2), (3) and (4) discussed supra, a photoacid generator (PAG), and a casting solvent. Negative tone photo-patternable dielectric formulations according to embodiments of the present invention may optionally include one or more additives such as organic bases, cross-linking agents and additive polymers.

Examples of PAGs include, but are not limited to, triphenylsulfonium nonaflate, co (trifluoro-methylsulfonyloxy)-bicyclo[2.2.1]hept-5-ene-2,3-dicarboximide (MDT), N-hydroxy-naphthalimide (DDSN), onium salts, aromatic diazonium salts, sulfonium salts, diaryliodonium salts, and sulfonic acid esters of N-hydroxyamides, imides, or combinations thereof.

Examples of casting solvents include, but are limited to, ethoxyethylpropionate (EEP), a combination of EEP and γ-butyrolactone, propylene-glycol monomethylether acetate (PGMEA), propylene-glycol monomethylether alcohol, propylene-glycol monopropyl alcohol, propylene-glycol monopropyl acetate, ethyl lactate, or combinations thereof.

The organic base may be any suitable organic base known in the photoresist art. Examples of organic bases include, but are not limited to, tetraalkylammonium hydroxides, cetyltrimethylammonium hydroxide, 1,8-diaminonaphthalene, and combinations thereof The negative tone photo-patternable dielectric formulations of the embodiments of the present invention are not limited to any specific selection of organic base.

Examples of cross-linking agents include, but are not limited to, methylphenyltetramethoxymethyl glycouril (methylphenyl POWDERLINK), tetramethoxymethyl glycouril, methylpropyltetramethoxymethyl glycouril, and 2,6-bis(hydroxymethyl)-p-cresol.

An example of a polymer additive is the silsesquioxanes polymer having the structural formula:

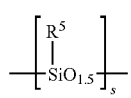

(5)

wherein $R^5$ is selected from the group consisting of alkyl, cycloalkyl and aryl moieties and s is an integer between about 10 and about 1000. Many polymers of structural formula (5) are commercially available, for example, from Dow Corning, Shin-Etsu, or JSR Corporation.

In one example, the silsesquioxane polymer additive possesses silanol end groups, but may also include halosilane, acetoxysilane, silylamine, and alkoxysilane endgroups. In a preferred embodiment of the present invention the additive polymer is a silsesquioxane polymer LKD-2015 (JSR Corporation) that contains silanol end groups.

The additive polymer comprises between about 1% by weight to about 99% by weight of all polymers of the negative tone photo-patternable dielectric formulations, with between about 20% by weight and 80% by weight preferred, and between about 30% by weight and 60% by weight more preferred.

Figure 1B:
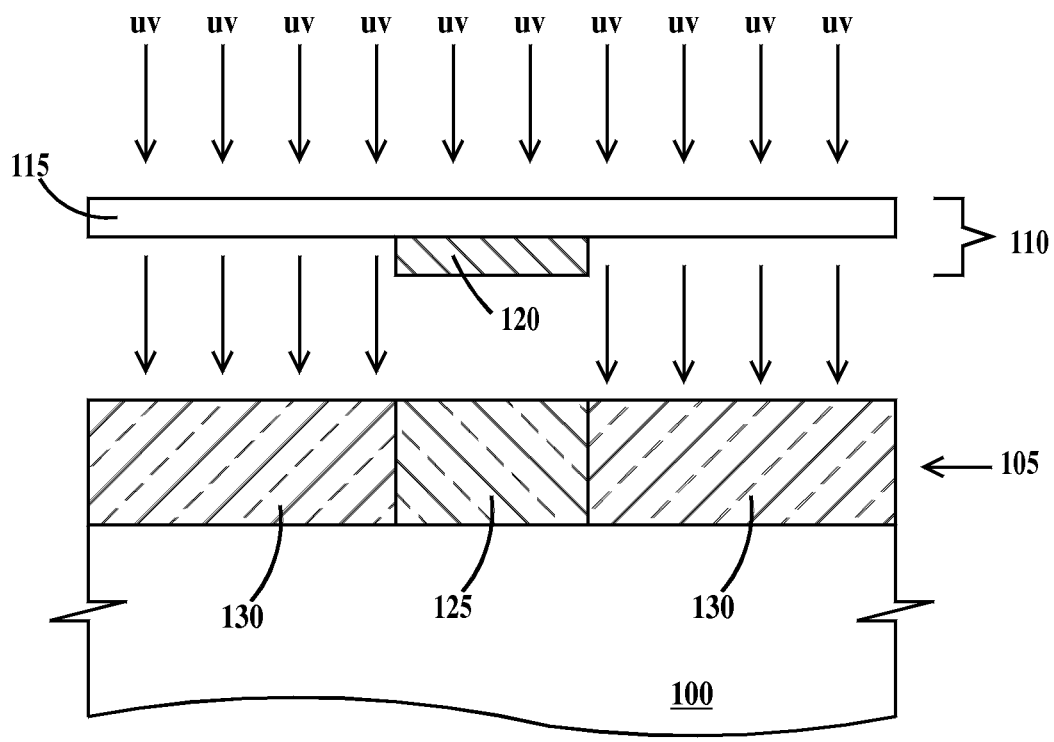
Figure 1C:
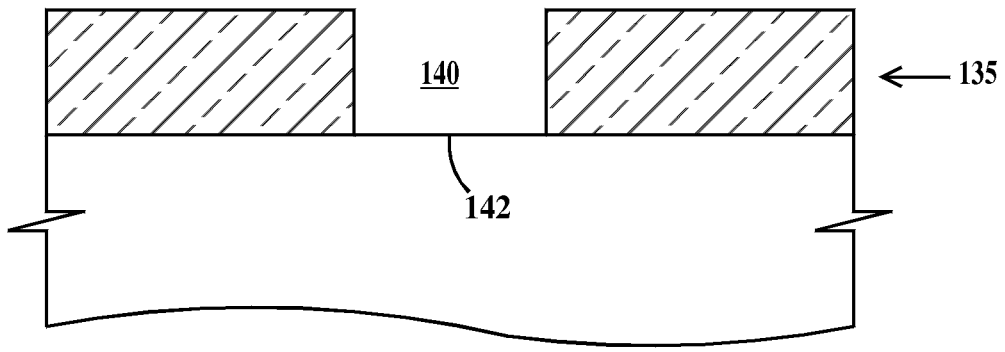

FIGS. 1A through 1C illustrate steps in a method of forming single or dual-damascene wires using a photo-patternable dielectric material according to embodiments of the present invention. In FIG. 1A, a photo-patternable dielectric layer 105 is formed on a substrate 100. Photo-patternable dielectric layer 105 is formed by spin coating, spraying or dip coating substrate 100 with a negative tone photo-patternable dielectric formulation according to embodiments of the present invention described supra. If a negative tone photo-patternable dielectric formulation includes an optional casting solvent, after applying the negative tone photo-patternable dielectric formulation a pre-exposure bake at a temperature between about 80° C. and about 120 ° C. with about 110° C. preferred is performed to drive out the casting solvent and form photo-patternable dielectric layer 105. In one example, substrate 100 includes devices such as field effect transistors, bipolar transistors, diodes, resistors, capacitors and inductors as well as contacts and damascene and/or dual-damascene wires (which wires may be formed using embodiments of the present invention or conventional processes).

In FIG. 1B, photo-patternable dielectric layer 105 is patternwise exposed to UV light through a mask 110. Mask 110 comprises a transparent or semi-transparent (to the wavelength of the UV light being used) substrate 115 having an opaque or semi-opaque to the wavelength of the UV light being used) image 120. More light passes through substrate 115 than through the combination of substrate 115 and image 120. One image 120 is illustrated, but there are typically hundreds of thousands to millions of such images present on a mask used to form integrated circuits. Upon exposure to the UV light, a pattern of unexposed regions 125 and exposed regions 130 is formed in photo-patternable dielectric layer 105. In one example, the UV light has a wavelength of about 248 nm. In one example, the UV light has a wavelength of about 193 nm.

In FIG. 1C, a post exposure bake followed by a develop process followed by a curing process is performed to form a patterned dielectric layer 135 having an opening 140 therein. A top surface 142 of substrate 140 is exposed in the bottom of opening 140. In one example, the post-exposure bake is performed at a temperature between about 35° C. and about 200° C. with a temperature between about 80° C. and about 120° C. preferred. The patternwise UV exposure causes the photoacid generator(s) in photo-patternable dielectric layer 105 (see FIG. 1B) to generate acid which cross-links the polymer through the hydroxyl, alkoxy, silyloxy or silanol endgroups and, if present, the $R^4$ group of the structural formula (4) monomers in regions 130 (see FIG. 1B) making the polymer insoluble in basic developer. The post exposure bake enhances this cross-linking process. Suitable developers include organic or aqueous bases with aqueous basic developers preferred. In one example the developer is an aqueous solution of tetramethylammonium hydroxide. In one example, the curing process is a bake at a temperature of about 400° C. or higher. In one example, the curing process is a UV exposure using light of a wavelength between about 50 nm and about 300 nm. In one example, the curing process includes simultaneous exposure to UV light at a wavelength between about 50 nm and about 300 nm and heating to about 400° C. or higher. The curing process cross-links the polymer through the $R^2$ group of the structural formula (2) monomers in regions 130.

Figure 2A:
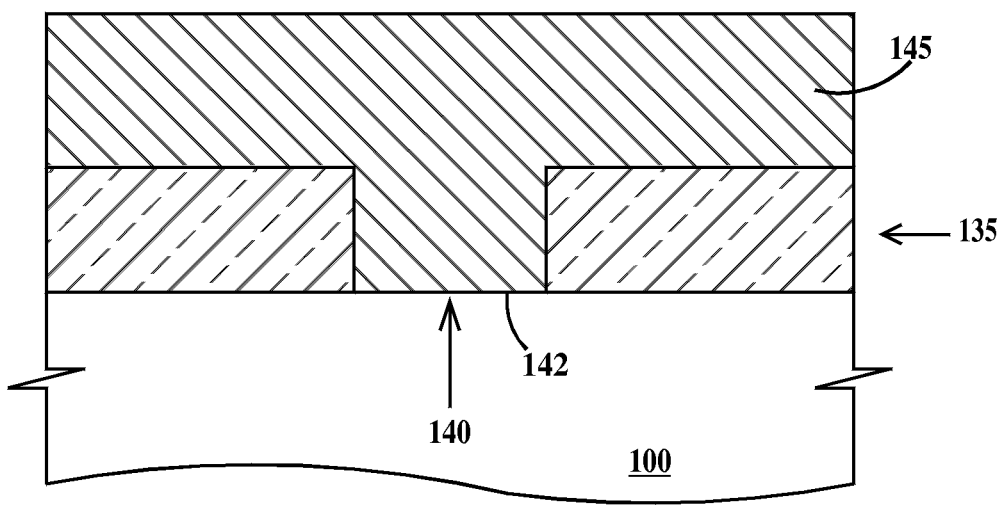
FIGS. 2A and 2B illustrate steps in a method of forming single damascene wires in a photo-patternable dielectric material according to embodiments of the present invention.
Figure 2B:
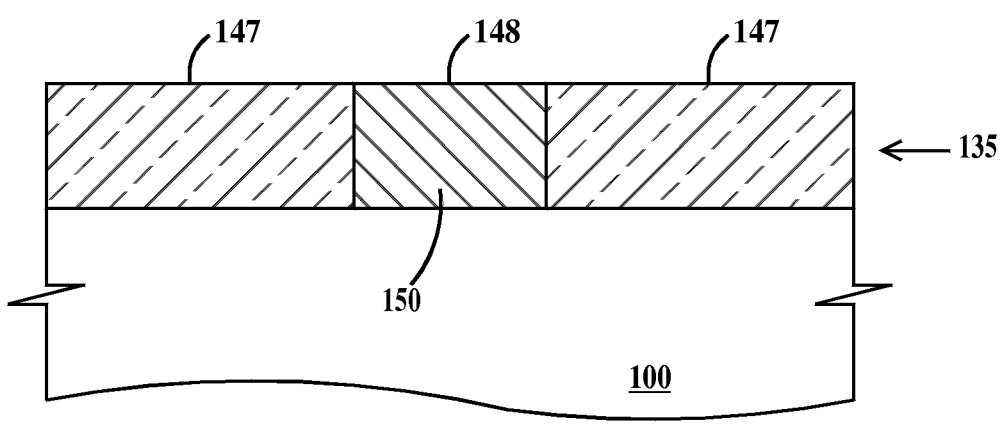

FIGS. 2A and 2B illustrate steps in a method of forming single damascene wires in a photo-patternable dielectric material according to embodiments of the present invention. FIG. 2A continues from FIG. 1C.

Figure 3A:
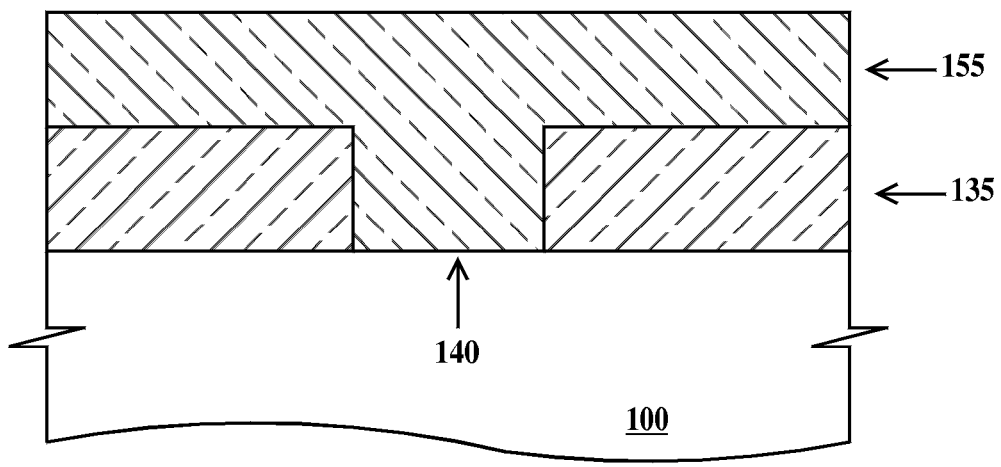
FIGS. 3A through 3E illustrate steps in a method of forming dual-damascene wires in a photo-patternable dielectric material according to embodiments of the present invention.
Figure 3B:
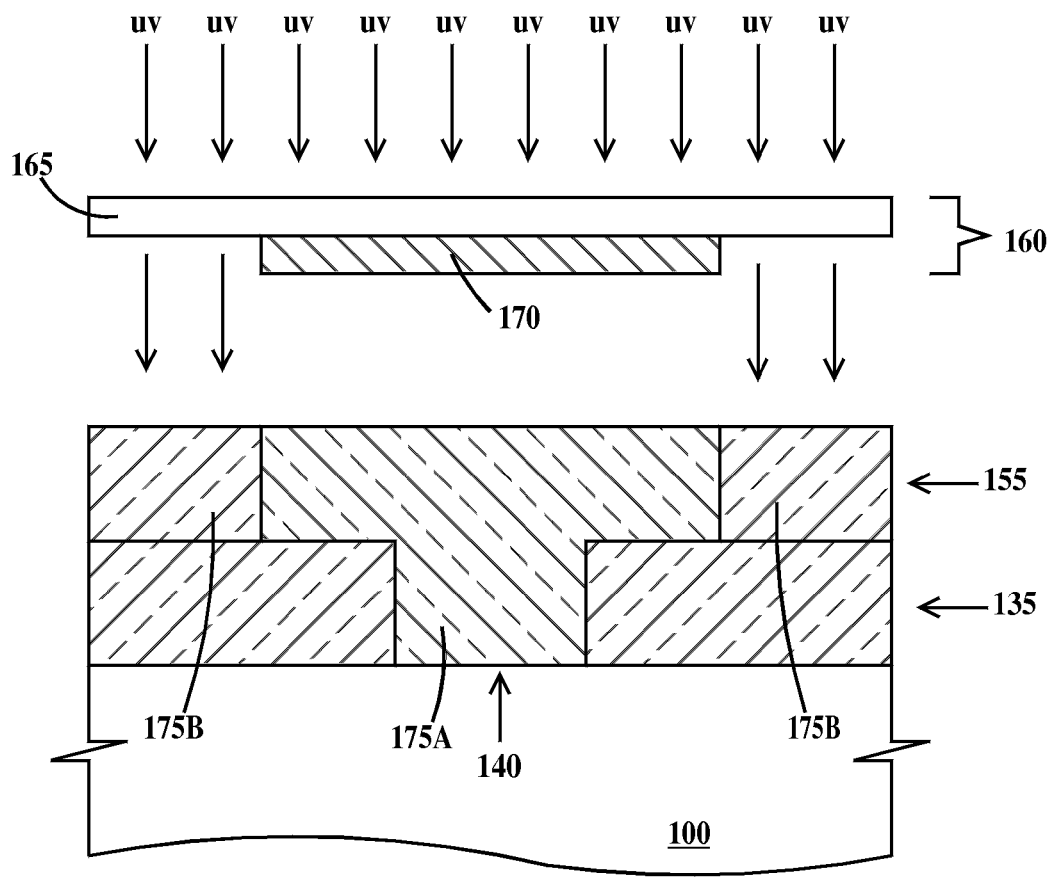
Figure 3C:
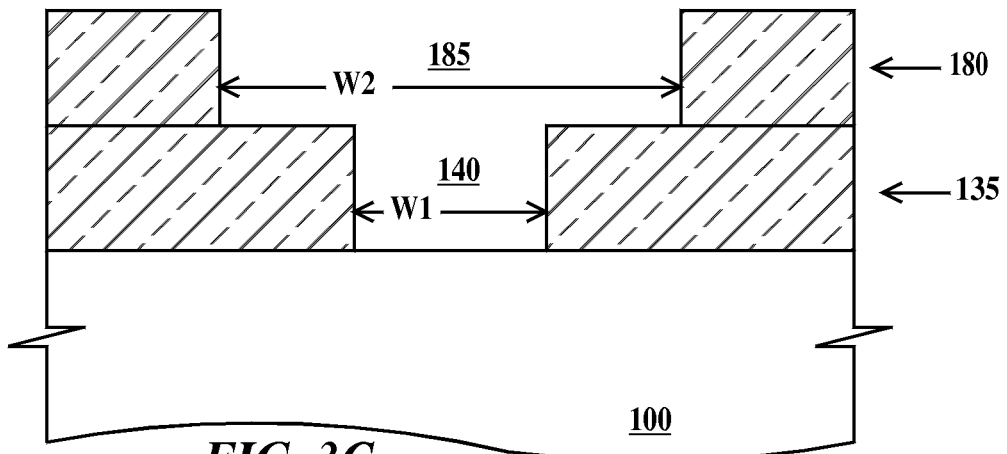

In FIG. 2A, a layer 145 of electrically conductive material is formed on the top surface of patterned dielectric layer 135 and the top surface 142 of substrate 100 exposed in opening 140. Layer 145 completely fills opening 140. In one example, layer 145 comprises one or more layers of metal. In one example, layer 145 comprises a conformal layer of tantalum nitride in contact with patterned dielectric layer 135 (including the sidewalls of opening 140) and substrate 100, a conformal layer of tantalum on the tantalum nitride layer, and a copper layer (i.e., core) on the tantalum layer. In FIG. 2B, planarization process (e.g., a chemical-mechanical-polish (CMP)) is performed so a top surface 147 of patterned dielectric layer 135 is coplanar with a top surface 148 of single-damascene wire (or contact) 150. Wire 150 may electrically contact a device (e.g., a gate electrode of an FET) or another wire of a lower wiring level in substrate 100.1 FIGS. 3A through 3C illustrate steps in a method of forming dual-damascene wires in a photo-patternable dielectric material according to embodiments of the present invention. FIG. 3A continues from FIG. 1C.

In FIG. 3A, a photo-patternable dielectric layer 155 is formed on a patterned dielectric layer 135 filling opening 140. Photo-patternable dielectric layer 155 is formed by spin coating, spraying or dip coating substrate 100 with a negative tone photo-patternable dielectric formulation according to embodiments of the present invention described supra. If a negative tone photo-patternable dielectric formulation includes a optional casting solvent, after applying the negative tone photo-patternable dielectric formulation a pre-exposure bake (e.g., at a temperature between about 80° C. and about 120° C. with about 110° C. preferred) is performed to drive out the casting solvent and form photo-patternable dielectric layer 155.

In FIG. 3B, photo-patternable dielectric layer 155 is patternwise exposed to ultraviolet (UV) light through a mask 160. Mask 160 comprises a transparent or semi-transparent (to the wavelength of the UV light being used) substrate 165 having an opaque or semi-opaque (to the wavelength of the UV light being used) image 160. More light passes through substrate 165 than through the combination of substrate 165 and image 170. One image 160 is illustrated, but there are typically hundreds of thousands to millions of such images present on a mask used to form integrated circuits. Upon exposure to the UV light, a pattern of unexposed regions 175A and exposed regions 175B is formed in photo-patternable dielectric layer 155. In one example, the UV light has a wavelength of about 248 nm. In one example, the UV light has a wavelength of about 193 nm.

In FIG. 3C, a post exposure bake followed by a develop process followed by a curing process is performed to form a patterned dielectric layer 180 having an opening 185 therein. Opening 140 in patterned dielectric layer 135 is exposed in the bottom of opening 185. Opening 140 has a width W1 and opening 180 has a width W2 with W2>W1. In one example, the post-exposure bake is performed at a temperature between about 35° C. and about 200° C., with a temperature between about 80° C. and about 120° C. preferred. The patternwise UV exposure causes the photoacid generator(s) in photo-patternable dielectric layer 155 (see FIG. 3B) to generate acid which cross-links the polymer through the hydroxyl, alkoxy, silyloxy or silanol endgroups and, if present, the $R^4$ group of structural formula (4) monomers in regions 180 (see FIG. 3B) making the polymer insoluble in basic developer. The post exposure bake enhances this cross-linking process. In one example, the curing process is a bake at a temperature of about 400° C. or higher. In one example, the curing process is a UV exposure. In one example, the curing process includes a combination of exposure to UV light and heating to about 400° C. or higher. In combination, the UV exposure and heating may be performed separately or simultaneously. The curing process cross-links the polymer through the $R^2$ group of the structural formula (2) monomers in regions 180.

Figure 3D:
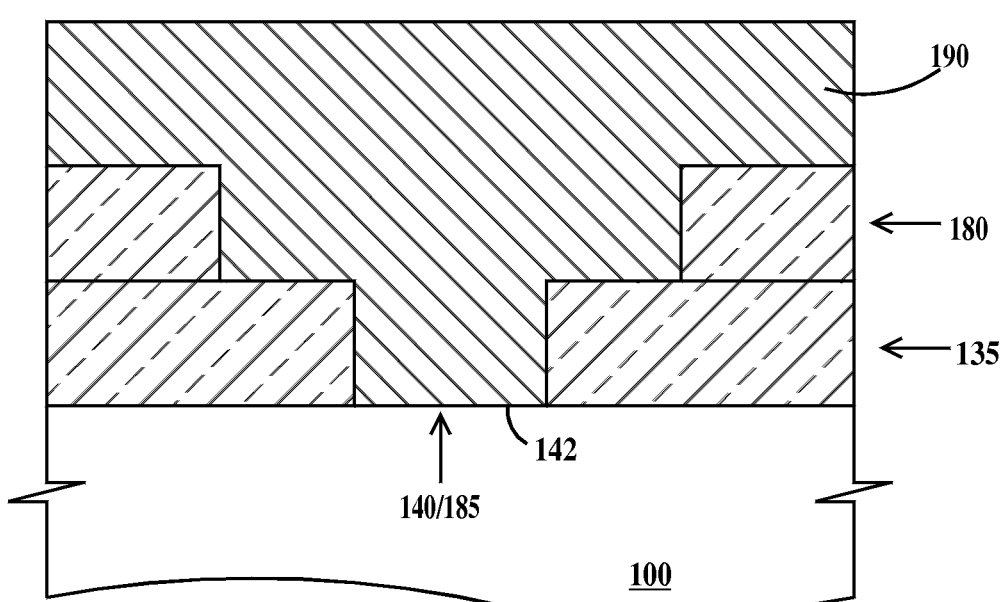

In FIG. 3D, a layer 190 of electrically conductive material is formed on the top surface of patterned dielectric layer 180, exposed surfaces of patterned dielectric layer 135, and the top surface 142 of substrate 100 exposed in opening 140. Layer 190 completely fills openings 140 and 185. In one example, layer 190 comprises one or more layers of metal. In one example, layer 190 comprises a conformal layer of tantalum nitride in contact with patterned dielectric layers 135 and 180 (including the sidewalls of openings 140 and 180 and the top surface of patterned dielectric that was exposed in opening 185 in FIG. 3C) and substrate 100, a conformal layer of tantalum on the tantalum nitride layer, and a copper layer (i.e., core) on the tantalum layer.

Figure 3E:
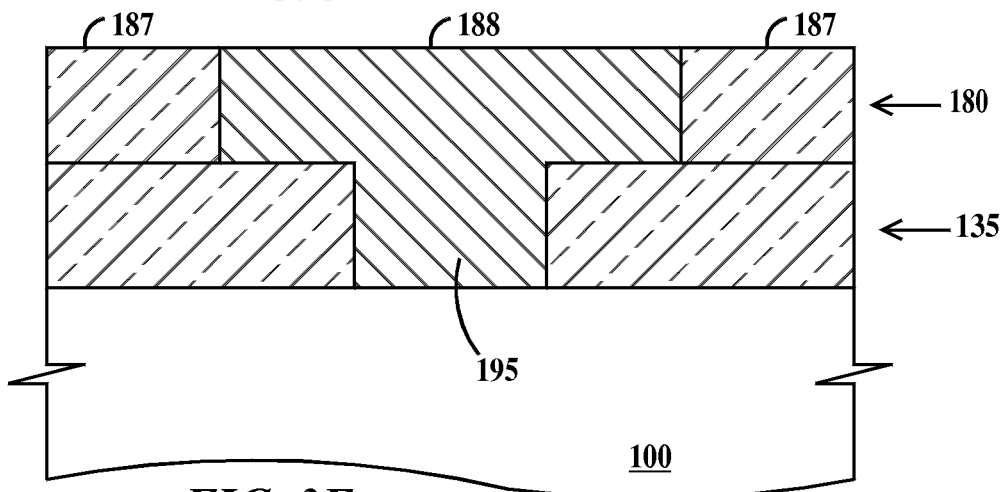

In FIG. 3E, a planarization process (e.g., a CMP) is performed so a top surface 187 of patterned dielectric layer 180 is coplanar with a top surface 188 of a dual-damascene wire 195. Wire 195 may electrically contact another wire of a lower wiring level in substrate 100.

Figure 4:
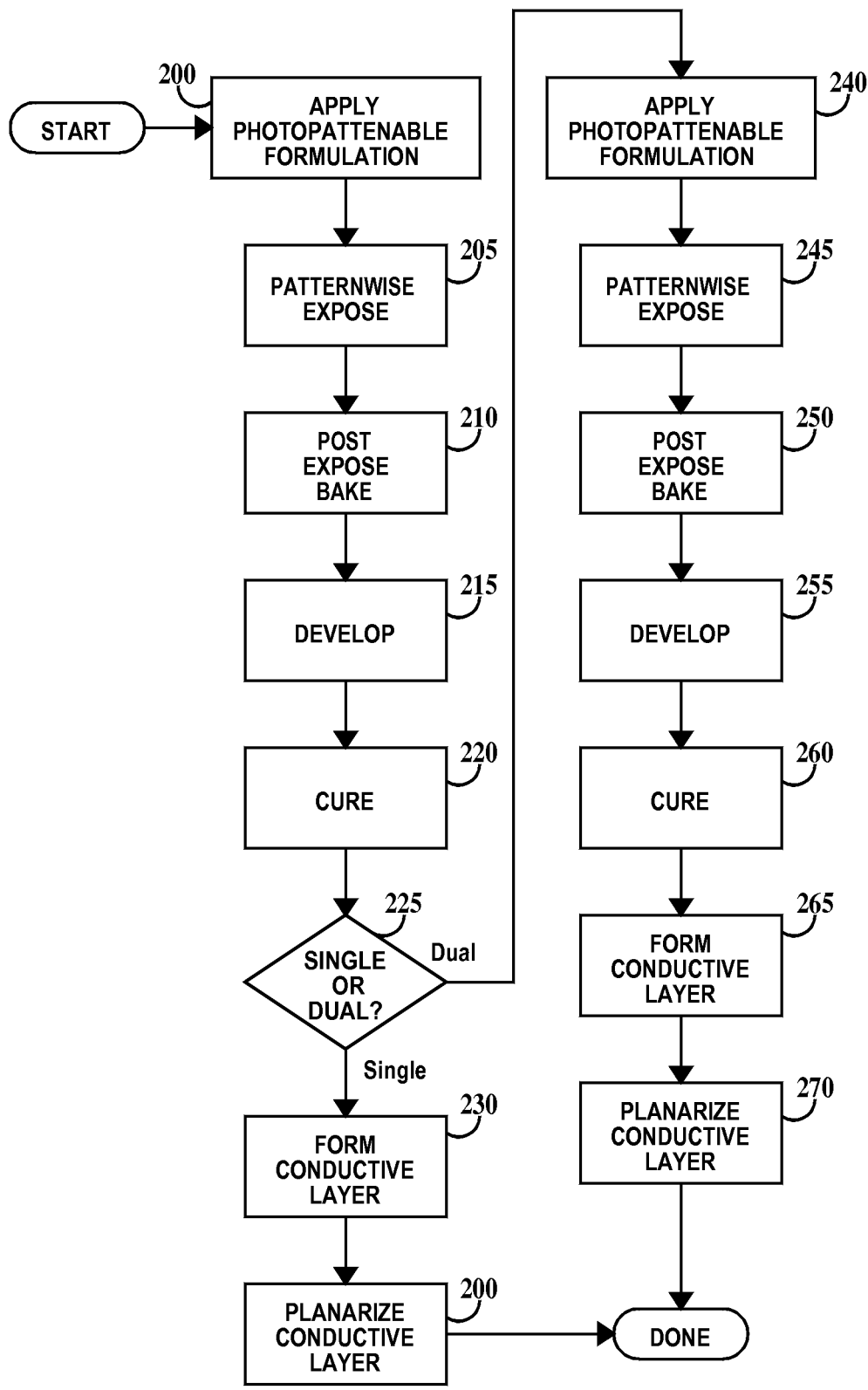
FIG. 4 is a flowchart describing a method of forming single-and dual damascene wires in dielectric material formed using a negative tone photo-patternable dielectric formulation according to embodiments of the present invention.

FIG. 4 is a flowchart describing a method of forming single-and dual damascene wires in dielectric material formed using a negative tone photo-patternable dielectric formulation according to embodiments of the present invention. In step 200, a negative tone photo-patternable dielectric formulation according to embodiments of the present invention is applied to form a photo-patternable dielectric layer on a substrate (e.g., an integrated circuit undergoing fabrication) as illustrated in FIG. 1A and described supra. In step 205, the photo-patternable dielectric layer is patternwise exposed as illustrated in FIG. 1B and described supra. In step 210, a post exposure bake is performed, in step 215 the exposed photo-patternable dielectric layer is developed, and in step 220, the developed photo-patternable dielectric layer is cured to form a patterned dielectric layer as illustrated in FIG. 1C and described supra.

In step 225, it is decided if the wire to be formed is to be a single-damascene wire or a dual-damascene wire. If a single-damascene wire is to be formed the method proceeds to step 230.

In step 230, an electrically conductive layer as illustrated in FIG. 2A and described supra is formed and in step 235 a planarization process as illustrated in FIG. 2B and described supra is performed to complete fabrication of a single-damascene wire.

Returning to step 225, if a dual-damascene wire is to be formed the method proceeds to step 240. In step 240, a negative tone photo-patternable dielectric formulation according to embodiments of the present invention is applied to form a photo-patternable dielectric layer on a substrate (e.g., an integrated circuit undergoing fabrication) as illustrated in FIG. 3A and described supra. In step 245, the photo-patternable dielectric layer is patternwise exposed as illustrated in FIG. 3B and described supra. In step 250, a post exposure bake is performed, in step 255 the exposed photo-patternable dielectric layer is developed, and in step 260, the developed photo-patternable dielectric layer is cured to form a patterned dielectric layer as illustrated in FIG. 3C and described supra. In step 265, an electrically conductive layer as illustrated in FIG. 3D and described supra is formed and in step 270 a planarization process as illustrated in FIG. 3E and described supra is performed to complete fabrication of a dual-damascene wire.

Figure 5:
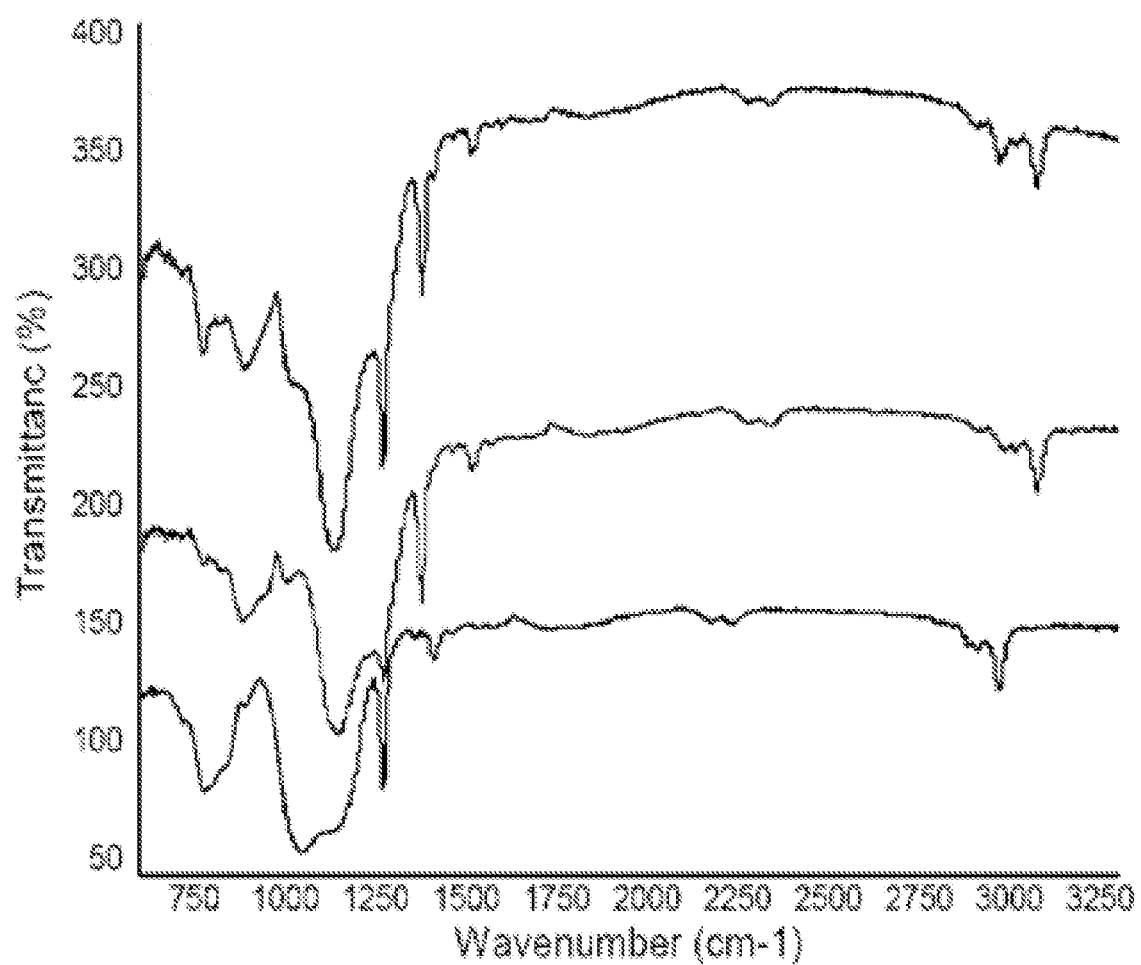
FIG. 5 is a set of transmittance vs. wavenumber infrared spectra for samples generated from a negative tone photo-patternable dielectric formulation according to embodiments of the present invention at different processing steps.

FIG. 5 is a set of transmittance vs. wavenumber infrared spectra for samples generated from a negative tone photo-patternable dielectric formulation according to embodiments of the present invention at different processing steps. In FIG. 5, the upper spectrum (furthest from the wavenumber scale) is of a negative tone photo-patternable dielectric formulation as spun applied. The middle spectrum is after a thermal cure only. The lower spectrum is after a combination UV and thermal cure. The peaks at about 1500 cm$^{-1}$ the pair of peaks around 3000 cm$^{-1}$ show the C=C and =C—H bands respectively of the R$^2$ group of the structural formula (2) monomer. The 1500 cm$^{-1}$ peak and the first peak of the pair at 3000 cm$^{-1}$ diminish as cross-linking increases.

Figure 6:
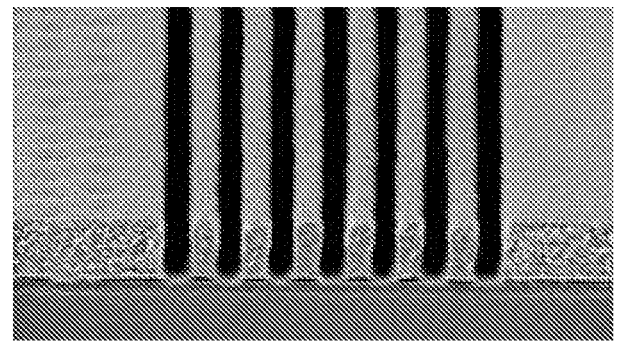
FIGS. 6 and 7 are scanning electron microscope photographs of dielectric structures formed using a negative tone photo-patternable dielectric formulation according to embodiments of the present invention.
Figure 7:
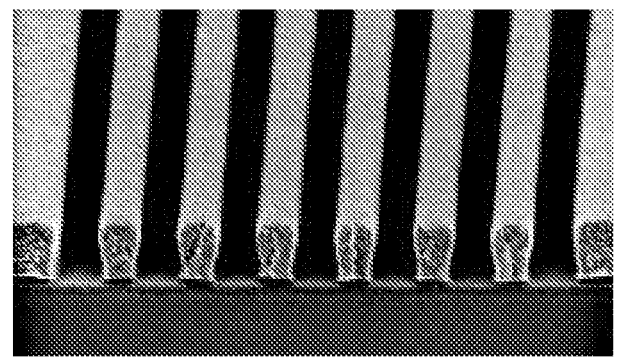

FIGS. 6 and 7 are scanning electron microscope photographs of dielectric structures formed using a negative tone photo-patternable dielectric formulation according to embodiments of the present invention. A negative tone photo-patternable dielectric formulation was prepared by mixing a 20 wt % solution of poly (methylsilsesquioxane-co-vinylsilsesquioxane-co-tetraethoxysilane) and 2 wt % of triphenylsulfonium nonaflate in PGMEA, and 0.4 wt % of an organic base. The resulting low-k formulation was filtered through a 0.2 µm filter. The low-k composition was spin coated onto an 8 inch silicon wafer and pre-exposure baked at 110° C. for 60 s, patternwise exposed to 248 nm DUV light on an ASML (0.63 NA, ⅝ annular) DUV stepper, and post exposure baked at 110° C. for 60 seconds This was followed by a 30 second puddle development step with aqueous 0.26 N tetramethyl ammonium hydroxide (TMAH) developer to resolve 0.190 µm mask line and space features. FIG. 6 shows the structural formula of trenches generated with an 8 mJ exposure and FIG. 7 shows the structural formula of trenches generated with an 11 mJ exposure.

EXAMPLES

The following examples provide further description of the present invention. The invention is not limited to the details of the examples. Where appropriate, the following techniques and equipment were utilized in the Examples: $^1$H and $^{13}$C NMR spectra were obtained at room temperature on an Avance 400 spectrometer. Quantitative $^{13}$C NMR was run at room temperature in acetone-d$_6$ in an inverse-gated $^1$H-decoupled mode using Cr(acac)$_3$ as a relaxation agent on an Avance 400 spectrometer. Thermo-gravimetric analysis (TGA) was performed at a heating rate of 5° C./min in N$_2$ on a TA Instrument Hi-Res TGA 2950 Thermogravimetric Analyzer. Differential scanning calorimetry (DSC) was performed at a heating rate of 10° C./min on a TA Instruments DSC 2920 modulated differential scanning calorimeter. Molecular weights were measured in tetrahydrofuran (THF) on a Waters Model 150 chromatograph relative to polystyrene standards. IR spectra were recorded on a Nicolet 510 FT-IR spectrometer on a film cast on a KBr plate. Film thickness was measured on a Tencor alpha-step 2000. A quartz crystal microbalance (QCM) was used to study the dissolution kinetics of the resist films in an aqueous tetramethylammonium hydroxide (TMAH) solution (CD-26).

When terpolymers and quadpolymers according to the present invention are synthesized using triethoxymethylsilane, the monomer of structural formula (1) is generated with R$^1$ being —CH$_3$ and the monomer may be called methylsilsdesquioxane. When terpolymers and quadpolymers according to the present invention are synthesized using triethoxyvinylsilane, the monomer of structural formula (2) is generated with R$^2$ being —CH=CH$_2$ and the monomer may be called vinylsilsesquioxane. When terpolymers and quad-polymers according to the present invention are synthesized using bis-trimethoxysilyl ethane, the monomer of structural formula (3) is generated with R$^3$ being —CH$_2$—CH$_2$— and the monomer may be called bis-silsequioxylethane. When terpolymers and quadpolymers according to the present invention are synthesized using tertaethoxysilane, the monomer of structural formula (4) is generated with R$^4$ being O—CH$_2$—CH$_3$ and the monomer may be called tetraethoxysilane.

Example 1

Synthesis of Poly[(methylsilsesquioxane-co-vinyl-silsesquioxane-co-tetraethoxysilane)]

A 250 milliliter (ml) three neck round-bottom flask equipped with a thermocouple thermometer, magnetic stirrer, condenser with nitrogen inlet, and a temperature controlled heating mantle was charged with a mixture of triethoxymethylsilane (42.12 grams, 0.24 moles), triethoxyvinylsilane (6.25 g, 0.03 mole), tetraethoxysilane (5.71 grams, 0.03 moles), 54.7 grams of methyl isobutyl ketone and 21 ml of a 1.75% solution of oxalic acid in water. The mixture was heated with stirring under nitrogen. The reaction mixture was initially inhomogeneous, but after 10 minutes at reflux became homogeneous with a reflux temperature of 80° C. The reflux was continued for a total of 7 hours. The mixture was cooled to room temperature and diluted with 50 ml of ethyl acetate. This mixture was extracted with six 50 ml portions of deionized water (final water extract was neutral to pH paper). The organic layer was evaporated to yield 22.50 grams of a hard foam after evacuation at high vacuum and room temperature for 24 hours. Inverse gated $^{13}$C NMR in acetone in the presence of chromium acetylacetonate gave a ratio of vinyl carbons to methyl carbons of 2:8.

Example 2

Synthesis of Poly[(methylsilsesquioxane-co-vinyl-silsesquioxane-co-bis-silsesquioxylethane-co-tetra-ethoxysilane)]

A 250 ml three neck round-bottom flask equipped with a thermocouple thermometer, magnetic stirrer, condenser with nitrogen inlet, and a temperature controlled heating mantle was charged with a mixture of triethoxymethylsilane (49.92 grams, 0.28 moles), triethoxyvinylsilane (3.81 g, 0.02 mole), Tetraethoxysilane (8.33 grams, 0.04 moles), bis-trimethoxysilyl ethane (5.41 grams, 0.02 mole), 67.5 grams of methyl isobutyl ketone and 25.2 ml of a 1.75% solution of oxalic acid in water. The mixture was heated with stirring under nitrogen. The reaction mixture was initially inhomogeneous, but after 10 minutes at reflux became homogeneous with a reflux temperature of 79.3° C. The reflux was continued for a total of 7 hours. The mixture was cooled to room temperature and diluted with 150 ml of ethyl acetate. This mixture was extracted with two 150 ml portions of deionized water and filtered through a medium glass frit to remove traces of in-solubles. The filtered solution was washed with four additional 150 ml portions of deionized water (final water extract was neutral to pH paper). The organic layer was evaporated to yield 27.2 grams of a hard foam after evacuation at high vacuum and room temperature for 24 hours. The molar ratio of the monomers (1), (2), (3) and (4) was 14:1:1:2.

Example 3

Synthesis of Poly[(methylsilsesquioxane-co-vinyl-silsesquioxane-co-bis-silsesquioxylethane-co-tetra-ethoxysilane)]

A 250 ml three neck round-bottom flask equipped with a thermocouple thermometer, magnetic stirrer, condenser with nitrogen inlet, and a temperature controlled heating mantle was charged with a mixture of triethoxymethylsilane (46.36 grams, 0.26 moles), triethoxyvinylsilane (7.61 g, 0.04 mole), Tetraethoxysilane (8.33 grams, 0.04 moles), bis-trimethoxysilyl ethane (5.41 grams, 0.02 mole), 67.5 grams of methyl isobutyl ketone and 25.2 ml of a 1.75% solution of oxalic acid in water. The mixture was heated with stirring under nitrogen. The reaction mixture was initially inhomogeneous, but after 10 minutes at reflux became homogeneous with a reflux temperature of 79.4° C. The reflux was continued for a total of 7 hours. The mixture was cooled to room temperature and diluted with 150 ml of ethyl acetate. This mixture was extracted with six 150 ml portions of deionized water (final water extract was neutral to pH paper). The organic layer was evaporated to yield 30.07 grams of a hard foam after evacuation at high vacuum and room temperature for 24 hours. The molar ratio of the monomers (1), (2), (3) and (4) was 13:2:2:1.

Example 4

Synthesis of Poly[(methylsilsesquioxane-co-vinyl-silsesquioxane-co-bis-silsesquioxylethane)]

Methyltriethoxysilane (53.49 grams, 0.3 mole), vinyltriethoxysilane (20.76 grams, 0.109 mole), bis(triethoxysilane)ethane (7.38 grams, 0.026 mole), and tetra orthosilicate (11.36 grams, 0.055 mole) were mixed together with 4-methyl-2-pentanone (77.78 ml) in a three-necked 500 milliliter round-bottom flask. 1.75 wt % oxalic acid solution (25.2 grams) was added to the above solution at 60° C. resulting in an exothermic reaction. The temperature of the reaction mixture was brought down to 70° C., and thereafter the reaction mixture was stirred at 78.8° C. for 6 hours. To extract the polymer, ethyl acetate (150 ml) was added to the reaction mixture at room temperature and the solution was washed (7-8 times) with distilled water. Evaporating the solvent under reduced pressure afforded the polymer (27 gram).

Example 5

Nanoindentation Measurements

The Young's modulus for the cured materials was determined by nanoindentation. Films of a control poly(metylsilsesquoxane-co- bis-silsesquioxylethane) and two poly (methylsilsesquioxane-co-vinylsesquioxane-co-bis-silsesquioxylethane-co-tetraethoxysilane) were spin applied onto a silicon wafers and then post-applied baked at 110° C. for 1 min, exposed to 248 nm light, post-exposure baked at 110° C. for 1 min, and then UV-thermally cured at 400° C. The mole proportions of monomers of the poly(metylsilsesquoxane-co-bis-silsesquioxylethane) was 15:1 and the measured modulus was 5.4 GPa. The mole proportions of monomers of the first poly tetraethoxysilane) was 13.5:1.5:1 and the measured modulus was 9.9 GPa. The mole ratios of monomers of the second poly (methylsilsesquioxane-co-vinylsilsesquioxane-co-bis-silsesquioxylethane-co-tetraethoxysilane) was 13:2:1 and the measured modulus was 10.89 GPa

Example 6

Photo-Patterning

A patternable low-k composition was formulated with 20 wt % solution of Methylsilsesquioxane-co-Vinylsilsesquioxane-co-TEOS and 2 wt % of triphenylsulfonium nonaflate in PGMEA, and 0.4 parts of an organic base. The resulting low-k formulation was filtered through a 0.2 µm filter. The low-k composition was spin coated onto an 8 inch silicon wafer and pre-exposure baked at 110° C. for 60 seconds, patterwise exposed to 248 nm DUV light on an ASML (0.63 NA, ⅝ annular) DUV stepper, and post exposure baked at 110° C. for 60 seconds. This was followed by a 30 seconds puddle development step with 0.26 N TMAH developer to resolve 0.190 µm line and space features.

Thus the embodiments of the present invention provides patternable dielectric materials, photo-sensitive formulations containing patternable dielectric materials, methods of using photo-sensitive formulations containing patternable dielectric materials in the fabrication of integrated circuits, and integrated circuit structures comprising patternable dielectric materials. The methods according to embodiments of the present invention use less materials and require less steps than conventional methods.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:
1. A composition of matter comprising:
a silsesquioxane polymer consisting essentially of the four repeat units of the structural formulas (1), (2), (3), (4):

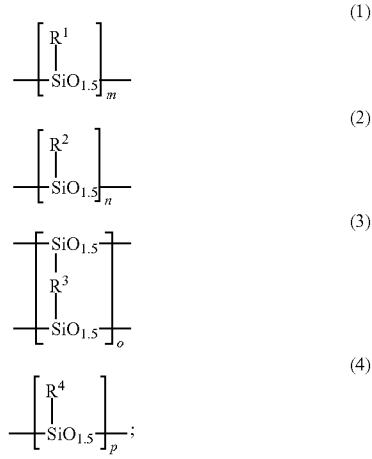

wherein $R^1$ is selected from the group consisting of linear alkyl, branched alkyl, cycloalkyl, aromatic, arene and ester moieties;

wherein R² is selected from the group consisting of vinyl, substituted-vinyl, acetylenic, substituted acetylenic and nitrile moieties;

wherein R³ is selected from the group consisting of linear alkyl, branched alkyl and cycloalkyl moieties;

wherein R⁴ is selected from the group consisting of linear alkoxy, branched alkoxy, cycloalkoxy, acetoxys, hydroxyl, silyloxy and silanol moieties; and wherein m, n, o, and p represent the mole percent (mol %) of repeating units with m+n+o+p equal to about 100 mol % and wherein when only three repeat units are present either o or p is zero.

2. The composition of matter of claim 1, wherein said silsesquioxane polymer is soluble in aqueous basic solution.

3. The composition of matter of claim 1, wherein said silsesquioxane polymer has a molecular weight of between about 1500 Daltons and about 20,000 Daltons.

4. The composition of matter of claim 1, wherein said silsesquioxane polymer consists essentially of repeat units of structural formulas (1), (2), (3) and (4), R¹ is a methyl moiety and m is between about 70 mol % and about 80 mol %, R² is a vinyl moiety and n is between about 3 mol % and about 13 mol %, R³ is an ethylene moiety and o is between about 0.5 mol % and about 6 mol %, and R⁴ is a hydroxyl moiety and p is between about 2 mol % and about 10 mol %.

5. A photoactive formulation, comprising:
a photoacid generator;
a casting solvent; and
a silsesquioxane polymer consisting essentially of the four repeat units of the structural formulas (1), (2), (3), (4):

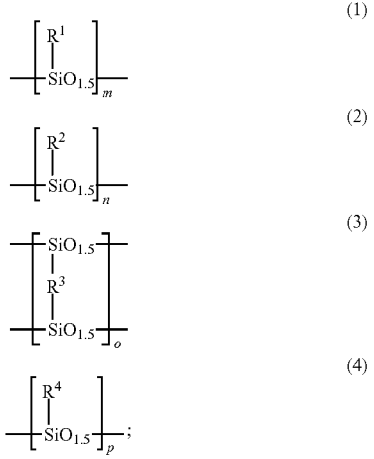

wherein R¹ is selected from the group consisting of linear alkyl, branched alkyl, cycloalkyl, aromatic, arene and ester moieties;

wherein R² is selected from the group consisting of vinyl, substituted-vinyl, acetylenic, substituted acetylenic and nitrile moieties;

wherein R³ is selected from the group consisting of linear alkyl, branched alkyl and cycloalkyl moieties;

wherein R⁴ is selected from the group consisting of linear alkoxy, branched alkoxy, cycloalkoxy, acetoxys, hydroxyl, silyloxy and silanol moieties; and wherein m, n, o, and p represent the mole percent (mol %) of repeating units with m+n+o+p equal to about 100 mol % and wherein when only three repeat units are present either o or p is zero.

6. The photoactive formulation of claim 5, wherein said silsesquioxane polymer consists essentially of repeat units of structural formulas (1), (2), (3) and (4), R¹ is a methyl moiety and m is between about 70 mol % and about 80 mol %, R² is a vinyl moiety and n is between about 3 mol % and about 13 mol %, R³ is an ethyl moiety and o is between about 0.5 mol % and about 6 mol %, and R⁴ is a hydroxyl moiety and p is between about 2 mol % and about 10 mol %.

7. The photoactive formulation of claim 5, further including:
an additive silsesquioxane polymer of structure (5):

wherein R⁵ is selected from the group consisting of alkyl, cycloalkyl and aryl moieties; and wherein s is an integer between about 10 and about 1000.

8. The photoactive formulation of claim 5, further including:
one or more cross-linking agents, one or more organic bases or combinations thereof.

9. The photoactive formulation of claim 5, wherein said silsesquioxane polymer is soluble in aqueous solution of an organic base.

10. The photoactive formulation of claim 5, wherein said photoacid generator is selected from the group consisting of triphenylsulfonium nonaflate, co (trifluoro-methylsulfonyloxy)-bicyclo[2.2.1]hept-5-ene-2,3-dicarboximide (MDT), N-hydroxy-naphthalimide (DDSN), onium salts, aromatic diazonium salts, sulfonium salts, diaryliodonium salts, and sulfonic acid esters of N-hydroxyamides, imides, or combinations thereof.

11. The photoactive formulation of claim 5, wherein said casting solvent is selected from the group consisting of ethoxyethylpropionate (EEP), a combination of EEP and γ-butyrolactone, propylene-glycol monomethylether acetate (PGMEA), propylene-glycol monomethylether alcohol, propylene-glycol monopropyl alcohol, propyleneglycol monopropyl acetate, ethyl lactate, or combinations thereof.

12. The photoactive formulation of claim 5, further including:
one or more a cross-linking agents selected from the group consisting of methylphenyltetramethoxymethyl glycouril, tetramethoxymethyl glycouril, methylpropyltetramethoxymethyl glycouril, and 2,6-bis(hydroxymethyl)-p-cresol.

13. The photoactive formulation of claim 5, further including:
a silsesquioxane polymer additive having silanol end groups.

14. The photoactive formulation of claim 5, further including:
a silsesquioxane polymer additive having halosilane, acetoxysilane, silylamine, or alkoxysilane endgroups.

15. A composition of matter comprising:
a silsesquioxane polymer consisting essentially of repeat units of structural formulas (1), (2), (3) and (4);

  (1)

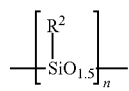  (2)

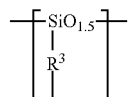  (3)

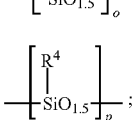  (4)

wherein $R^1$ is a methyl moiety and m is between about 70 mol % and about 80 mol %, $R^2$ is a vinyl moiety or substituted vinyl moiety and n is between about 3 mol % and about 13 mol %, $R^3$ is an ethylene moiety and o is between about 0.5 mol % and about 6 mol %, and $R^4$ is a hydroxyl moiety and p is between about 2 mol % and about 10 mol %.

16. The composition of matter of claim 15, wherein said silsesquioxane polymer is soluble in aqueous basic solution.

17. The composition of matter of claim 15, wherein said silsesquioxane polymer has a molecular weight of between about 1500 Daltons and about 20,000 Daltons.

18. A photoactive formulation, comprising:
a photoacid generator;
a casting solvent; and
a silsesquioxane polymer consisting essentially of repeat units of structural formulas (1), (2), (3) and (4);

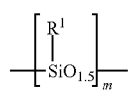  (1)

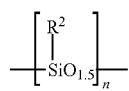  (2)

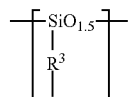  (3)

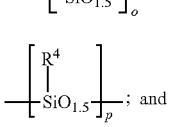  (4)

wherein $R^1$ is a methyl moiety and m is between about 70 mol % and about 80 mol %, $R^2$ is a vinyl moiety or substituted vinyl moiety and n is between about 3 mol % and about 13 mol %, $R^3$ is an ethylene moiety and o is between about 0.5 mol % and about 6 mol %, and $R^4$ is a hydroxyl moiety and p is between about 2 mol % and about 10 mol %.

19. The composition of matter of claim 18, wherein said silsesquioxane polymer is soluble in aqueous basic solution.

20. The composition of matter of claim 18, wherein said silsesquioxane polymer has a molecular weight of between about 1500 Daltons and about 20,000 Daltons.

21. A composition of matter, comprising:
(i) a silsesquioxane polymer additive having silanol end groups or (ii) a silsesquioxane polymer additive having halosilane, acetoxysilane, silylamine, or alkoxysilane endgroups or (iii) an additive silsesquioxane polymer of structure (5):

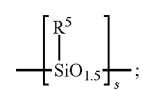  (5)

wherein $R^5$ is selected from the group consisting of alkyl, cycloalkyl and aryl moieties;
and wherein s is an integer between about 10 and about 1000; and
a silsesquioxane polymer comprising three or four repeat units of the structural formulas (1), (2), (3), (4):

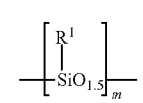  (1)

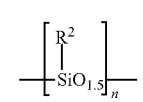  (2)

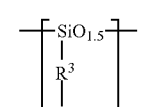  (3)

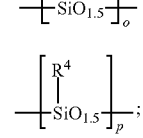  (4)

wherein two of said three or four repeat units are structures (1) and (2);
wherein $R^1$ is selected from the group consisting of linear alkyl, branched alkyl, cycloalkyl, aromatic, arene and ester moieties;
wherein $R^2$ is selected from the group consisting of vinyl, substituted-vinyl, acetylenic, substituted acetylenic and nitrile moieties;
wherein $R^3$ is selected from the group consisting of linear alkyl, branched alkyl and cycloalkyl moieties;
wherein $R^4$ is selected from the group consisting of linear alkoxy, branched alkoxy, cycloalkoxy, acetoxys, hydroxyl, silyloxy and silanol moieties; and
wherein m, n, o, and p represent the mole percent (mol%) of repeating units with m+n+o+p equal to or greater than about 40 mol % and wherein when only three repeat units are present either o or p is zero.

22. A photoactive formulation, comprising:
a photoacid generator;
a casting solvent;
(i) a silsesquioxane polymer additive having silanol end groups or (ii) a silsesquioxane polymer additive having halosilane, acetoxysilane, silylamine, or alkoxysilane endgroups or (iii) an additive silsesquioxane polymer of structure (5):

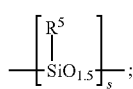
(5)

wherein $R^5$ is selected from the group consisting of alkyl, cycloalkyl and aryl moieties;
and wherein s is an integer between about 10 and about 1000; and
a silsesquioxane polymer comprising three or four repeat units of the structural formulas (1), (2), (3), (4):

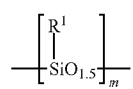
(1)

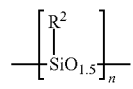
(2)

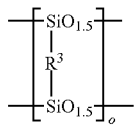
(3)

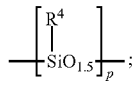
(4)

wherein two of said three or four repeat units are structures (1) and (2);
wherein $R^1$ is selected from the group consisting of linear alkyl, branched alkyl, cycloalkyl, aromatic, arene and ester moieties;
wherein $R^2$ is selected from the group consisting of vinyl, substituted-vinyl, acetylenic, substituted acetylenic and nitrile moieties;
wherein $R^3$ is selected from the group consisting of linear alkyl, branched alkyl and cycloalkyl moieties;
wherein $R^4$ is selected from the group consisting of linear alkoxy, branched alkoxy, cycloalkoxy, acetoxys, hydroxyl, silyloxy and silanol moieties; and
wherein m, n, o, and p represent the mole percent (mol %) of repeating units with m+n+o+p equal to or greater than about 40 mol % and wherein when only three repeat units are present either o or p is zero.

23. A photoactive formulation, comprising:
a photoacid generator;
a casting solvent;
one or more a cross-linking agents selected from the group consisting of methylphenyltetramethoxymethyl glycouril, tetramethoxymethyl glycouril, methylpropyltetramethoxymethyl glycouril, and 2,6-bis(hydroxymethyl)-p-creso; and
a silsesquioxane polymer comprising three or four repeat units of the structural formulas (1), (2), (3), (4):

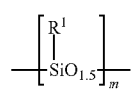
(1)

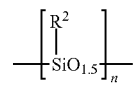
(2)

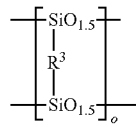
(3)

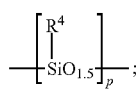
(4)

wherein two of said three or four repeat units are structures (1) and (2);
wherein $R^1$ is selected from the group consisting of linear alkyl, branched alkyl, cycloalkyl, aromatic, arene and ester moieties;
wherein $R^2$ is selected from the group consisting of vinyl, substituted-vinyl, acetylenic, substituted acetylenic and nitrile moieties;
wherein $R^3$ is selected from the group consisting of linear alkyl, branched alkyl and cycloalkyl moieties;
wherein $R^4$ is selected from the group consisting of linear alkoxy, branched alkoxy, cycloalkoxy, acetoxys, hydroxyl, silyloxy and silanol moieties; and
wherein m, n, o, and p represent the mole percent (mol %) of repeating units with m+n+o+p equal to or greater than about 40 mol % and wherein when only three repeat units are present either o or p is zero.

24. A composition of matter comprising:
one or more a cross-linking agents selected from the group consisting of methylphenyltetramethoxymethyl glycouril, tetramethoxymethyl glycouril, methylpropyltetramethoxymethyl glycouril, and 2,6-bis(hydroxymethyl)-p-creso; and
a silsesquioxane polymer comprising three or four repeat units of the structural formulas (1), (2), (3), (4):

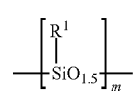
(1)

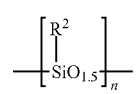
(2)

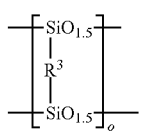
(3)

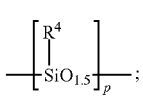
(4)

wherein two of said three or four repeat units are structures (1) and (2);
wherein $R^1$ is selected from the group consisting of linear alkyl, branched alkyl, cycloalkyl, aromatic, arene and ester moieties;

wherein $R^2$ is selected from the group consisting of vinyl, substituted-vinyl, acetylenic, substituted acetylenic and nitrile moieties;

wherein $R^3$ is selected from the group consisting of linear alkyl, branched alkyl and cycloalkyl moieties;

wherein $R^4$ is selected from the group consisting of linear alkoxy, branched alkoxy, cycloalkoxy, acetoxys, hydroxyl, silyloxy and silanol moieties; and wherein m, n, o, and p represent the mole percent (mol%) of repeating units with m+n+o+p equal to or greater than about 40 mol % and wherein when only three repeat units are present either o or p is zero.

* * * * *